United States Patent [19]
Vaidyanathan et al.

[11] Patent Number: 6,053,948
[45] Date of Patent: Apr. 25, 2000

[54] METHOD AND APPARATUS USING A MEMORY MODEL

[75] Inventors: Radha Vaidyanathan; Emil F. Girczyc, both of Los Altos, Calif.; Sivaram Krishna Nayudu, Jersey City, N.J.; Mahadevan Ganapathi, Sunnyvale, Calif.

[73] Assignee: Synopsys, Inc., Mountain View, Calif.

[21] Appl. No.: 08/995,708

[22] Filed: Dec. 22, 1997

Related U.S. Application Data

[63] Continuation of application No. 08/479,927, Jun. 7, 1995, abandoned.

[51] Int. Cl.[7] .................................................. G06F 17/50
[52] U.S. Cl. ................................ 703/14; 703/20; 703/21; 703/24; 703/25
[58] Field of Search .......................... 364/578; 395/500, 395/500.06, 500.12, 500.19, 500.21, 500.34, 500.35, 500.36, 500.41, 500.42, 500.46

[56] References Cited

U.S. PATENT DOCUMENTS

| | | | |
|---|---|---|---|
| 4,130,885 | 12/1978 | Dennis | 711/100 |
| 4,315,315 | 2/1982 | Kossiakoff | 395/701 |
| 4,455,619 | 6/1984 | Masui et al. | 345/509 |
| 4,527,249 | 7/1985 | Van Brunt | 395/500.36 |
| 4,584,642 | 4/1986 | Fudanuki | 395/500.36 |
| 4,587,625 | 5/1986 | Marino, Jr. et al. | 364/578 |
| 4,677,587 | 6/1987 | Zemany, Jr. | 395/500.21 |
| 4,695,968 | 9/1987 | Sullivan et al. | 395/500.34 |
| 4,725,971 | 2/1988 | Doshi | 395/500.35 |
| 4,725,975 | 2/1988 | Sasaki | 395/500.36 |
| 4,744,084 | 5/1988 | Beck | 714/33 |
| 4,787,062 | 11/1988 | Nei et al. | 395/500.36 |
| 4,827,427 | 5/1989 | Hyduke | 395/500.35 |
| 4,862,347 | 8/1989 | Rudy | 395/500.36 |
| 4,882,690 | 11/1989 | Shinsha et al. | 395/500.19 |
| 4,901,260 | 2/1990 | Lubschevsky | 395/500.38 |
| 4,918,594 | 4/1990 | Onizuka | 395/500.36 |
| 4,922,445 | 5/1990 | Mizoue et al. | 395/500.36 |
| 4,937,765 | 6/1990 | Shupe et al. | 702/187 |
| 5,029,102 | 7/1991 | Drumm et al. | 395/500.19 |
| 5,062,067 | 10/1991 | Schaefer et al. | 395/500.37 |
| 5,111,413 | 5/1992 | Lazansky et al. | 395/500.35 |
| 5,151,867 | 9/1992 | Hooper et al. | 395/500.19 |
| 5,175,843 | 12/1992 | Casavant et al. | 395/500.07 |
| 5,198,705 | 3/1993 | Galbraith et al. | 326/37 |
| 5,222,030 | 6/1993 | Dangelo et al. | 395/500.12 |
| 5,313,615 | 5/1994 | Newman et al. | 395/500.12 |
| 5,392,227 | 2/1995 | Hiserote | 395/500.35 |
| 5,528,752 | 6/1996 | Kise et al. | 714/29 |
| 5,544,067 | 8/1996 | Rostoker et al. | 395/500.35 |
| 5,559,718 | 9/1996 | Baisuck et al. | 395/500.06 |
| 5,819,063 | 10/1998 | Dahl et al. | 395/500 |

OTHER PUBLICATIONS

"Addressing the Systems–in–Silicon Verification Challenge," The Siliconization Opportunity, Cadence Design Systems (publication date unknown).

"NC—Verilog Simulator," Cadence Design Systems (publication date unknown).

"SpeedSim, Inc.: SpeedSim/3 Product Background," SpeedSim, Inc., 234 Littleton Road, Suite 2E, Westford, MA 01886 (publication date unknown).

"Voyager CS Mixed–Level VHDL System Verification Environment," IKOS Systems, Inc., 19050 Pruneridge Avenue, Cupertino, CA 95014 (last modified Aug. 29, 1995).

(List continued on next page.)

*Primary Examiner*—Kevin J. Teska
*Assistant Examiner*—Samuel Broda
*Attorney, Agent, or Firm*—Graham & James LLP

[57] ABSTRACT

A computer system including a memory model of a memory circuit. The computer system comprises a processor coupled to receive and manipulate the memory model, and a memory including the memory model. The memory model includes: a number of address bits corresponding to a number of address bits of the memory circuit; a number of data bits corresponding to a number of data bits of the memory circuit; and a memory type parameter corresponding to a type of the memory circuit.

28 Claims, 11 Drawing Sheets

OTHER PUBLICATIONS

"The SpeedSim/3 Software Simulator: Reducing the Time and Cost of Design Verification," SpeedSim, Inc., 234 Littleton Road, Suite 2E, Westford, MA 01886 (publication date unknown).

"VSC—A Verilog Compiler," Chronologic Simulation, johna@chronologic.com (publication date unknown).

Russel B. Segal, BDSYN: Logic Description Translator BDSIM: Switch–Level Simulator, May 21, 1987, Memorandum No. UCB/ERL M87/33.

D.E. Thomas, The System Architect's Workbench, 1988, 23.2.

Giovanni de Micheli, High–Level Synthesis of Digital Circuits, 1990, 6–7.

R. Camposano, From Behavior to Structure: High–Level Synthesis, 1990, 8–19.

J. Bhasker, An Optimizer for Hardware Synthesis, 1990, 20–36.

Giovanni de Micheli et al., The Olypmus Synthesis System, 1990, 37–53.

Srimat Chakradhar et al., Neural Net and Boolean Satisfiability Models of Logic Circuits, 1990, 54–57.

Mittra, "A Virtual Memory Management Scheme for Simulation Environment," Proceedings of the 1995 IEEE International Verilog HDL Conference, pp. 114–118, Mar. 1995.

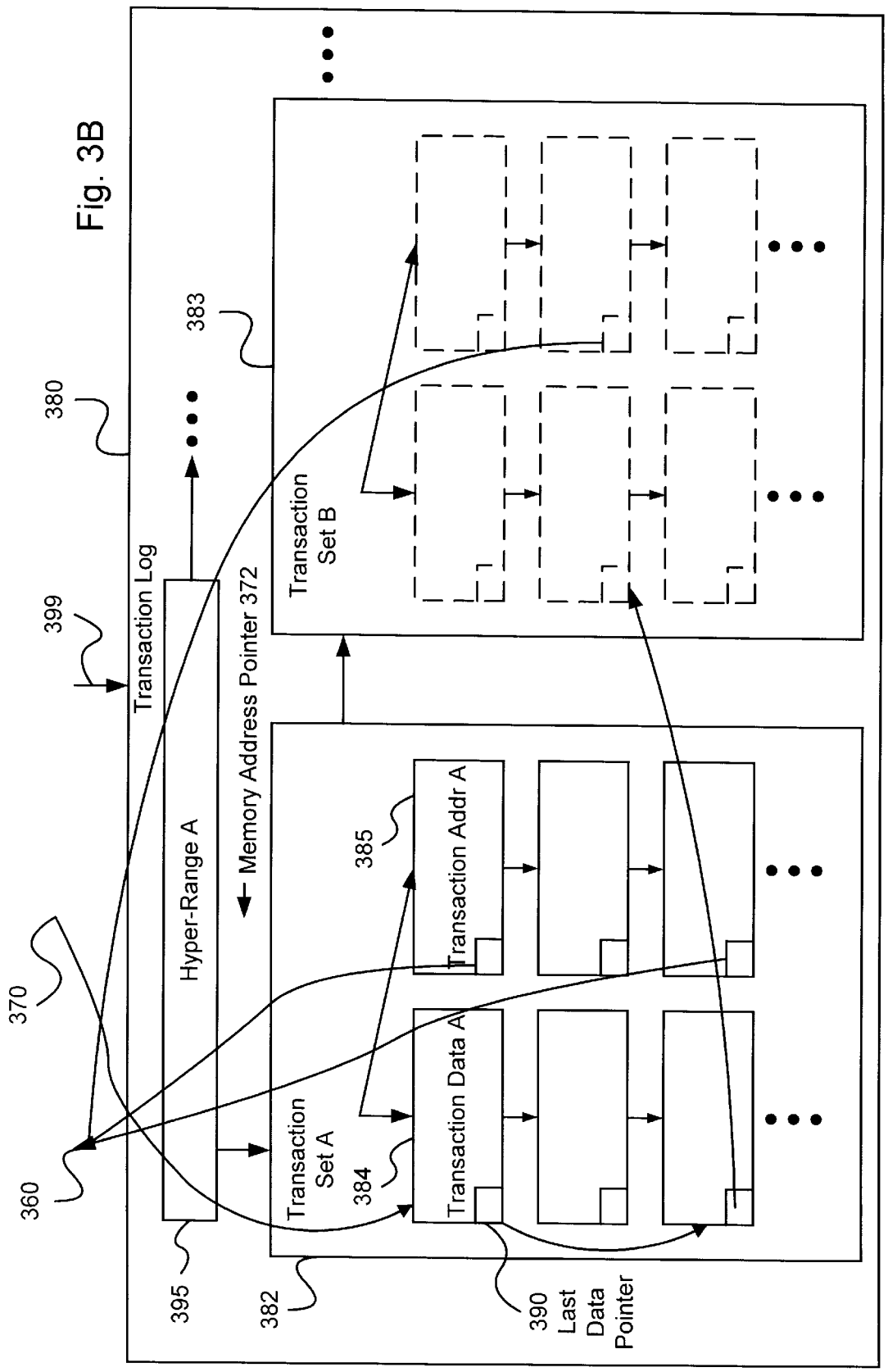

METHOD AND APPARATUS USING A MEMORY MODEL

This application is a continuation of application Ser. No. 08/479,927 filed Jun. 7, 1995 which application is now abandoned.

BACKGROUND OF THE INVENTION

1. Field of Invention

The present invention relates to the field of electronic design automation systems. In particular, the invention describes a memory model that can be used in electronic design automation systems.

2. Description of Related Art

Electronic design automation is a field of engineering where designers use computer systems and tools executing on those computer systems to design electronic circuits.

One of the goals of electronic design automation is to automate many of the design steps to allow designers to design circuits faster and cheaper than before. Example tools used by designers are a synthesis tool and a simulator. The synthesis tool allows a designer to provide the synthesis tool with a high level language description of a circuit, and the synthesis tool generates the corresponding circuit. A simulator allows a designer to simulate the operation of a circuit with different stimuli using a description of the circuit.

The description of the electronic circuit, often written in VHDL or Verilog, defines the operation of the circuit at a high level. That is, the description is a model of the circuit. A circuit model can be written to represent many different kinds of electronic circuits, for example, a multiplier, an arithmetic logic unit, a microprocessor, a PCI bus interface, etc.

Circuit models can be very complex. This adds to the amount of computing resources (memory and processing time) a given synthesis tool or simulator will need to process the circuit model. For simulation, it is desirable to simulate very larger circuits. For example, it is desirable to stimulate an entire computer system during the booting of the UNIX operating system. This requires a circuit model of the computer system. However, such a model would require large amounts of computing resources. For example, the computer model would need to include a model of a large amount of different kinds of memory (e.g. hard disk, RAM, ROM).

In previous systems, a circuit model of a memory (a memory model) in a simulator is represented by an array. During a simulation, each instance of a particular memory model causes the simulator to allocate a portion of the simulator memory to represent that memory model. For example, if a memory model represents a 4 Kbytes RAM, then the simulator instantiates a 4 Kbytes array to hold the data written to the 4 Kbytes RAM memory model. Thus, the previous simulator can simulate a RAM in a circuit.

However, this simulation technique has a number of drawbacks when applied to large memory models. Assume that a memory model of a large amount of RAM is to be used in a simulator, e.g. a memory system including 256 one Mbytes SIMMs. Further assume that the computer system upon which the simulator is executing only has 128 Mbytes of RAM. A previous simulator would attempt to allocate 256 one Mbytes arrays to represent the 256 one Mbytes SIMMs. Depending on the type of computer system upon which the previous simulator was executing, this would result in an error that would stop the simulation, or this would cause a large amount of very slow virtual memory to be used, significantly slowing the simulation (e.g. the extra 128 Mbytes of RAM would be allocated from a hard drive). It is highly unlikely that all this memory will be accessed during the simulation, but the prior art systems allocated the memory regardless. Therefore, it has been determined that a more efficient memory model should be supported in a simulator tool.

Another problem with using the previous memory models in simulation, and synthesis, is that there is little standardization among the memory models. One vendor will supply one type of interface to his/her memory models, while another vendor will supply another type of interface to his/her memory models. A designer must learn each type of interface, while the simulation tool must support each underlying memory model. Similarly, a synthesis tool must use special cases to synthesize a corresponding memory for each of the corresponding memory models. Therefore, it has been determined that a standardized memory model should be supported for a synthesis tool and a simulator.

SUMMARY OF THE INVENTION

A general purpose memory model is described.

A computer system including a memory model of a memory circuit. The computer system comprises a processor coupled to receive and manipulate the memory model, and a memory including the memory model. The memory model includes: a number of address bits corresponding to a number of address bits of the memory circuit; a number of data bits corresponding to a number of data bits of the memory circuit; and a memory type parameter corresponding to a type of the memory circuit.

Although a great deal of detail has been included in the description and figures, the invention is defined by the scope of the claims. Only limitations found in those claims apply to the invention.

BRIEF DESCRIPTION OF THE DRAWINGS

The present invention is illustrated by way of example, and not limitation, in the figures. Like references indicate similar elements.

DESCRIPTION OF THE PREFERRED EMBODIMENT

Overview of One Embodiment of the Present Invention

A general purpose memory model is described. In the following description, specific details are set forth such as data organizations, transaction logs, and memory model interfaces, etc., in order to provide a thorough understanding of the present invention. In other instances, known circuits, structures and techniques have not been shown in detail in order not to obscure the present invention.

One embodiment of the invention includes a memory model of a physical memory circuit. The memory model supports a standardized core interface from which complex memories can be defined. The core interface supports the initialization of the memory model using a user definable number of address bits and data bits. The user can define the type of memory (e.g. RAM or ROM).

In one embodiment, the same memory model can be used in both simulation and synthesis. This makes the design and testing of circuit models using the memory model simpler as only one memory model need be defined.

In one embodiment, during a simulation, a memory model tree is generated that tracks the data written to the memory model. The memory model tree saves computer resources of the computer system on which the memory model is being simulated because the memory model tree allocates memory for the memory model only when it is needed.

In one embodiment, the number of address bits is used to define the characteristics of the memory model tree. That is, the number of the address bits is used to define the number of levels the tree will have and how many child nodes each node in the tree will have.

In one embodiment, during simulation, checkpoints are created using a transaction log associated with the memory model. The checkpoints allow a designer to quickly roll a simulation back to a particular time of the simulation.

Computer System

Figure 1A:
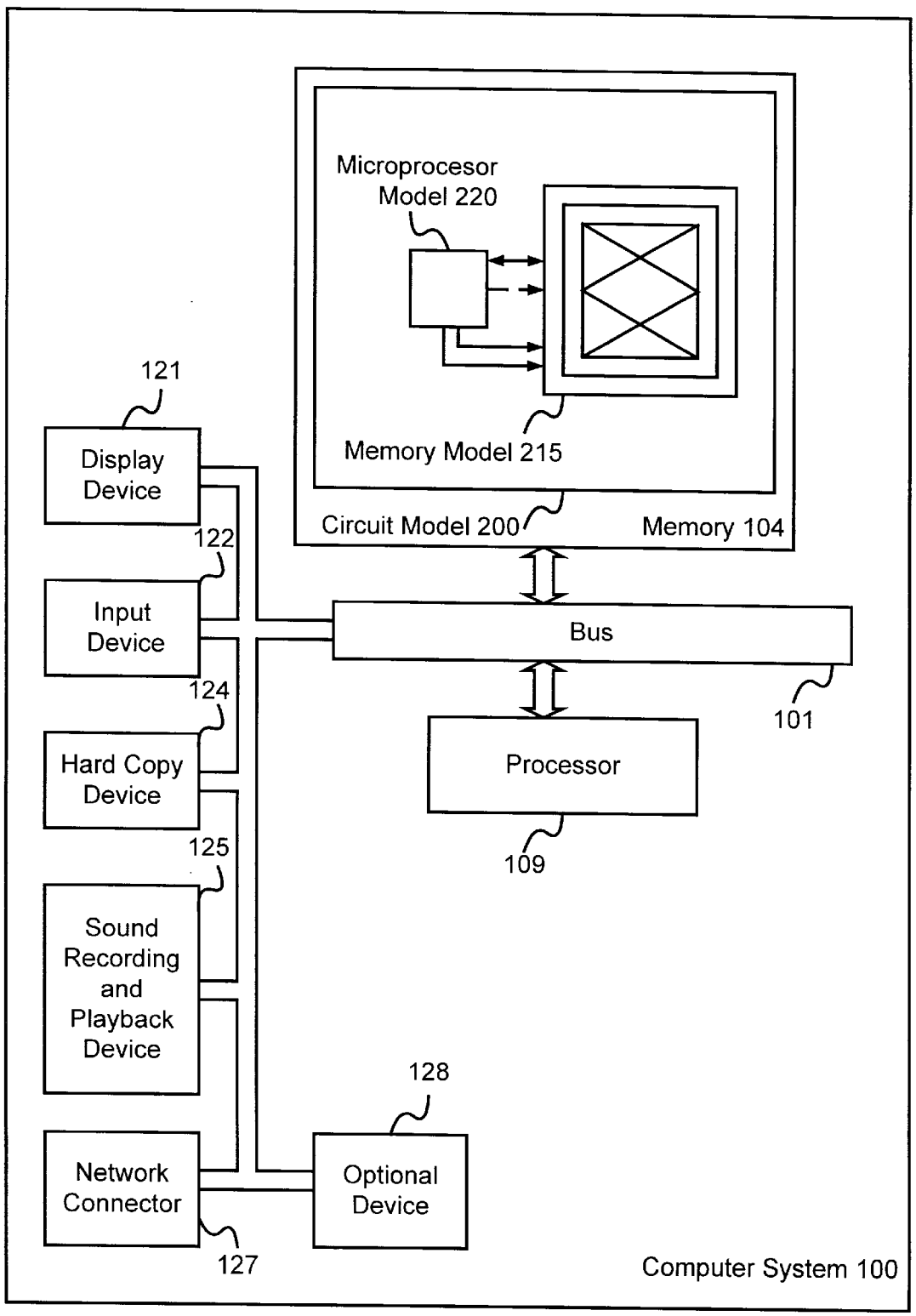
FIG. 1A illustrates a computer system.

FIG. 1A illustrates a computer system 100 upon which an embodiment of the invention can be implemented. The computer system 100 includes a bus 101, or other communications hardware and software, for communicating information, and a processor 109, coupled with the bus 101, for processing information. The processor 109 can be a single processor or a number of individual processors that can work together.

The computer system 100 further includes a memory 104. The memory 104 can include a random access memory (RAM), a read only memory (ROM), a magnetic disk, a digital tape system, or an optical or floppy disk and a corresponding disk drive, or some storage device. The memory 104 is coupled to the bus 101 and is for storing information and instructions to be executed by the processor 109. The memory 104 also may be used for storing temporary variables or other intermediate information during the execution of instructions by the processor 109. The memory 104 can store a circuit model 200 that includes a microprocessor model 220 and a memory model 215.

The computer system 100 can also include a display device 121 for displaying information to a user. The display device 121 can be coupled to the bus 101. The display device 121 can include a frame buffer, specialized graphics rendering devices, a cathode ray tube (CRT), and/or a flat panel display. The bus 101 can include a separate bus for use by the display device 121 alone.

An input device 122 is typically coupled to the bus 101 for communicating information to the processor 109 from a user, such as command selections, and for controlling the cursor's movement on the display device 121. Input device 122 can include a keyboard, a mouse, a trackball, a pen, a touch screen, a touch pad, a digital tablet, or cursor direction keys, for communicating direction information to the processor 109. The input device 122 may allow two degrees of freedom, a first axis (e.g., x) and a second axis (e.g., y), which allow the input device 122 to specify positions in a plane. However, the computer system 100 is not limited to input devices with only two degrees of freedom.

Another device which may be optionally coupled to the bus 101 is a hard copy device 124 which may be used for printing instructions, data, or other information, on a medium such as paper, film, slides, or other types of media.

A sound recording and/or playback device 125 can optionally be coupled to the bus 101. For example, the sound recording and/or playback device 125 can include an audio digitizer coupled to a microphone for recording sounds. Further, the sound recording and/or playback device 125 may include speakers which are coupled to digital to analog (D/A) converter and an amplifier for playing back sounds. Sound recording and/or playback device 125 can allow computer system to process and respond to voice commands.

Also, the computer system 100 can be part of a computer network (for example, a LAN) using an optional network connector 127, being coupled to the bus 101. In one embodiment of the invention, an entire network can then also be considered to be part of the computer system 100.

An optional device 128 can optionally be coupled to the bus 101. The optional device 128 can include, for example, a PCMCIA card and a PCMCIA adapter. The optional device 128 can further include an optional device such as modem or a wireless network connection.

Synthesis System

Figure 1B:
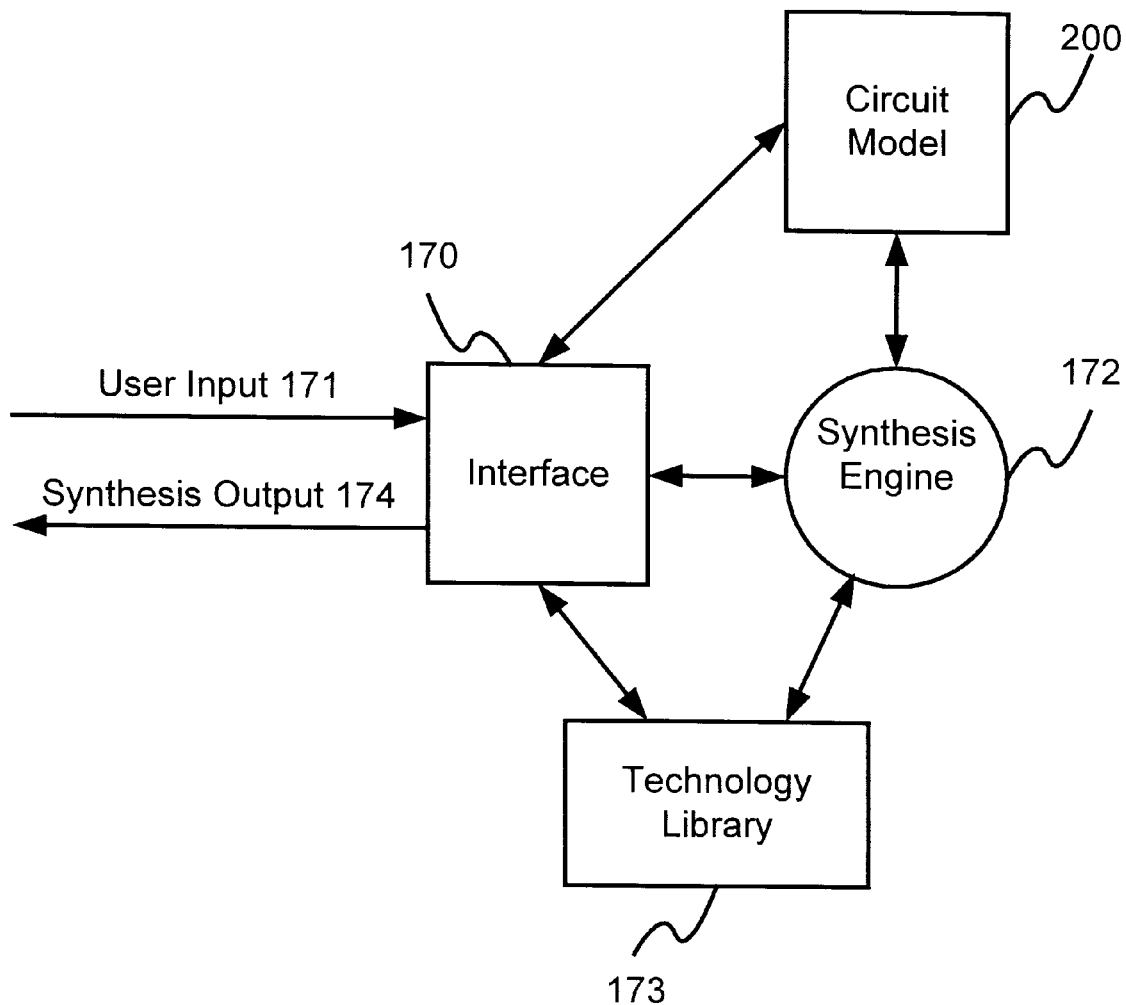
FIG. 1B illustrates a synthesis system.

FIG. 1B illustrates one embodiment of a synthesis system that uses a memory model. This system can be implemented on the computer system 100.

A user supplies the system with user input 171. User input 171 can include synthesis criteria, synthesis commands, and user interface commands. The synthesis criteria may include information like the type of optimizations to be performed. The synthesis commands can include, for example, a synthesize command. The user interface commands can manipulate the user interface.

The interface 170 receives the user input 171, controls the synthesis and communicates the synthesis output 174 to the user. The synthesis output 174 can include a description of a physical circuit that implements circuit model 200.

The interface 170 communicates with the synthesis engine 172. The synthesis engine 172 provides the main synthesis capabilities of the synthesis system. The technology library 173 provides the basic circuits from which a physical circuit representation of the circuit model 200 will be generated.

Simulation System

Figure 1C:
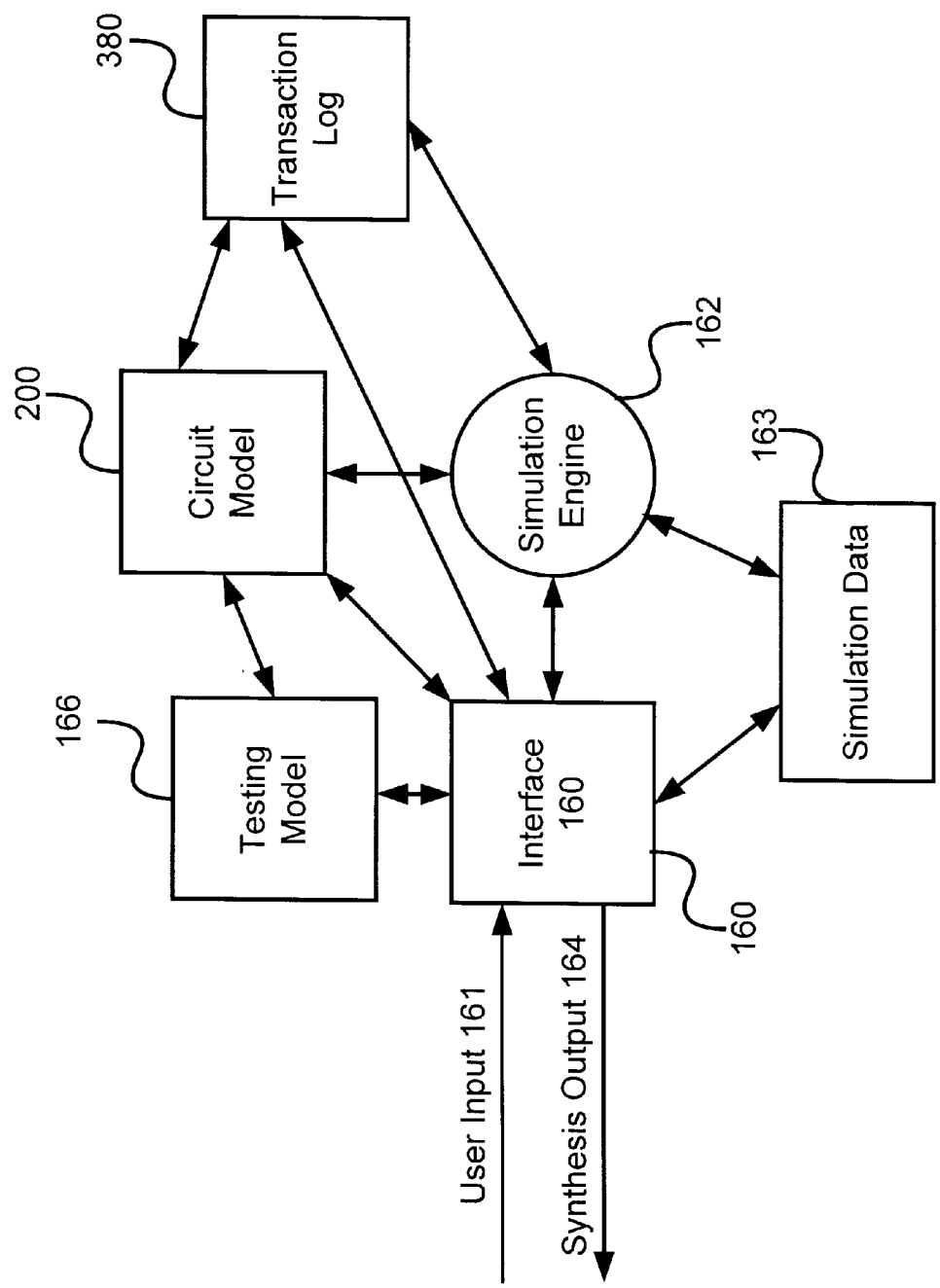
FIG. 1C illustrates a simulation system.

FIG. 1C illustrates one embodiment of a simulation system that uses a memory model. This system can be implemented on the computer system 100.

A user supplies the system with user input 161. User input 161 can include simulation data, simulation commands, and user interface commands. The simulation data may include information like the duration of a simulation. The simulation commands can include, for example, a simulate, a dump memory model, or a rollback the simulation command (described below). The user interface commands can manipulate the user interface.

The interface 160 receives the user input 161, controls the simulation and communicates the simulation output 164 to the user. The simulation output 164 can include the results of a simulation.

The interface 160 communicates with the simulation engine 162. The simulation engine provides the main simulation capabilities of the simulation system. For example, the simulation engine 162 can include the core of a cycle based simulator or an event driven simulation. For a cycle based simulator, the simulation engine 162 is responsible for compiling a circuit model 200, executing the simulation required by the user, and optionally, tracking the simulation in a transaction log 380. The circuit model 200 and the transaction log 380 are described below.

The simulation engine 162 uses the simulation data 163 to run a simulation. The simulation data 163 provides the stimuli for the circuit model 200. The simulation data 163 can also include the results of a simulation. Interface 160 allows a user to view and manipulate the simulation data 163.

The simulation system can optionally include the testing model 166. Testing model 166 allows a user to perform tests on the circuit model 200. For example, testing model 166 can act as a snooper to ensure that certain memory addresses in memory model 215 are being accessed during particular time periods.

Circuit Model

Figure 2:
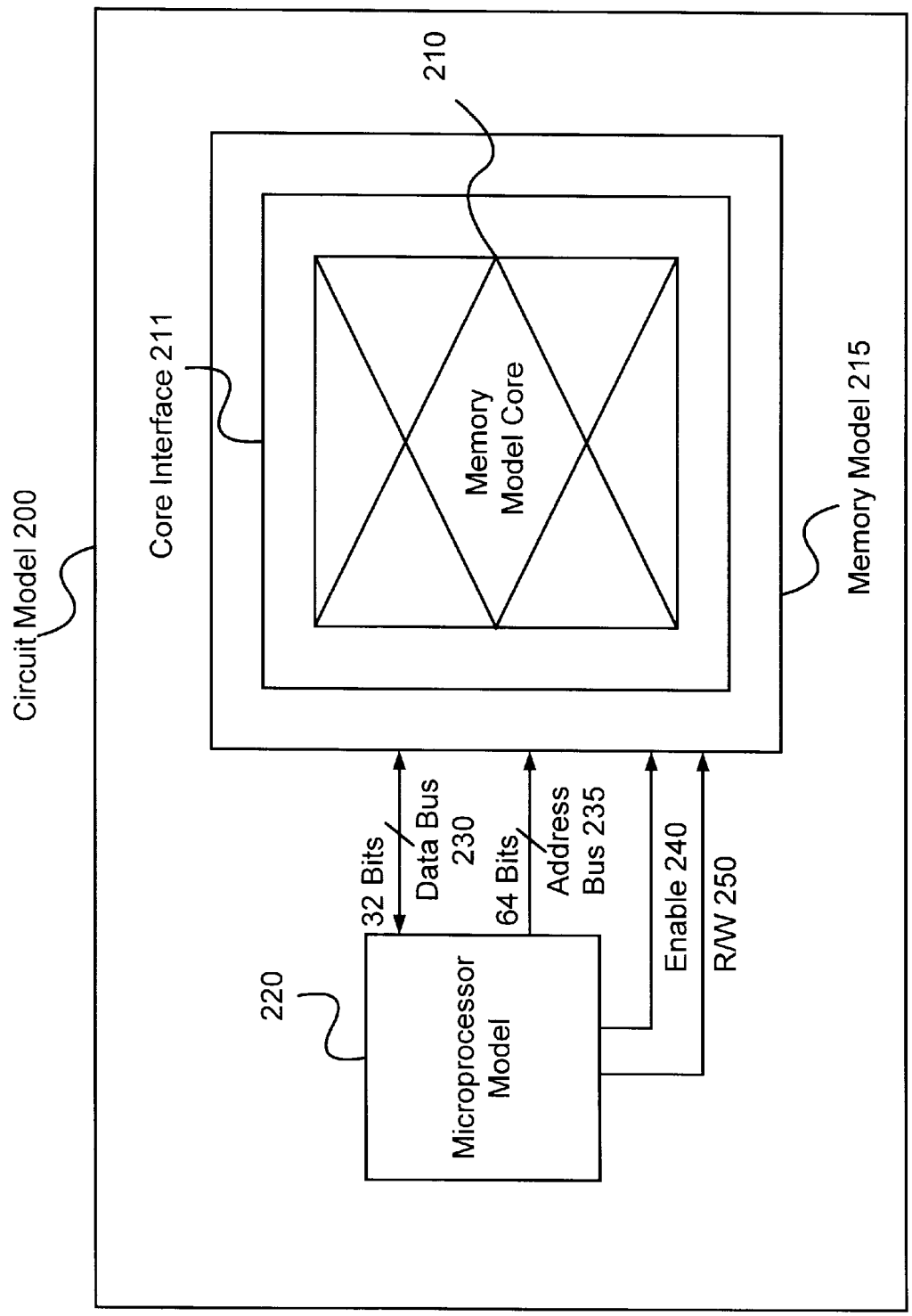
FIG. 2 illustrates a circuit model including a memory model.

FIG. 2 illustrates a circuit model 200 including a memory model 215. Memory 104 can store data corresponding to circuit model 200, thereby allowing processor 109 to manipulate the circuit model 200 using a number of electronic design automation tools. For example, processor 109, using the simulation system of FIG. 1C, or some other event based or cycle based simulator, can use circuit model 200 to simulate the operation of a physical circuit represented by circuit model 200. Further, processor 109 can use circuit model 200 to synthesize a corresponding physical circuit.

FIG. 2 is illustrative of one type of circuit model that can include a memory model, however, many different types of circuit models can include a memory model. For example, a cache control circuit model, a DRAM refresh circuit model, a video control circuit model, a dual ported VRAM circuit model, can all include a memory model.

In the example of FIG. 2, microprocessor model 220 is coupled to memory model 215. The microprocessor model 220 couples to the memory model 215 via a number of address, data and control lines: address bus 235, data bus 230, enable 240 and R/W 250, respectively.

The memory model 215 represents a physical memory device, such as a RAM. In this example, the memory model 215 has thirty-two bit data, a sixty-four bit address, an enable, and a read or write selector. Thus, memory model 215 can represent a very large physical memory ($2^{64}$ bytes of data). This feature is important if large and complex systems are to be synthesized and simulated. Remember that a goal of electronic design automation tools is to develop the next generation of electronic systems using present computer systems. Thus, it is desirable to model systems that have more capabilities than the computer system upon which the model is used. For example, memory model 215 may reside in memory 104, but memory 104 may only have a forty-eight bit address space, while memory model 215 has a sixty-four bit address space.

Memory model 215 includes the information needed to support a specific set of memory functions. For example, memory model 215 allows the microprocessor model 220 to read and write thirty-two bit data. For a read or a write, the microprocessor model 220 presents a sixty-four bit address on address bus 235. Data bus 230 carries thirty-two bit data between the microprocessor model 220 and the memory model 215. The R/W 250 indicates whether a particular access of memory model 215 should be a read or a write. Enable 240 indicates when the memory model 215 should execute the R/W 250 operation.

Memory model 215 includes a core interface 211 that provides an interface between the memory model 215 and the memory model core 210. The core interface 211 allows the memory model 215 to access the base functionality supported by the memory model core 210. In one embodiment, many different types of physical memory devices can be modeled using memory model 215, but each different type model includes the core interface 211 and the memory model core 210. Because a common core is used, different tools use a common way of accessing the memory model core 210. Thus, the same model can be used in different tools. Further, because a common (standardized) memory model core 210 is used, developing new memory models is simplified because a designer need only learn one type of memory model core 210.

The memory model core 210 includes the functions, data structures and models to model a basic memory. In one embodiment, the memory model core 210 models a read from only, or read from and write to, a memory location memory circuit. In one embodiment, the memory model core 210 initializes the memory to a specific address space and data size. In one embodiment, the memory model core 210 includes the ability to load the memory with data from a file. In one embodiment, the memory model core 210 allows a simulator, or other tool, to perform tests on the memory model core 210.

Table 1 shows one embodiment of a set of functions that are included in core interface 211 that allow memory model 215 to access memory model core 210. In one embodiment, the memory model core 210 is implemented in C++ or some other language. In one embodiment, the core interface 211 is implemented in a high level language such as VHDL or Verilog.

TABLE 1 initialize(#addressBits, #dataBits, memoryType(optional)) - VHDL code equivalent is function mem__init(kind : IN MemKind: n__addr : IN Positive; n__data : IN Positive) return MemHandle;
read(model, memoryModelAddress) - VHDL code equivalent is procedure mem__read (handle : IN MemHandle; addr: IN bit__vector; variable data : OUT bit__vector);
write(model, data, memoryModelAddress) - VHDL code equivalent is procedure mem__write (handle : IN MemHandle; addr : IN bit__vector; data : IN bit__vector);
loadMemory( model, fileName) - VHDL code is function mem__load (handle : IN MemHandle; fName : IN String; fType: IN MemFileType) return Boolean; fName is the name of a file. fType is the file type (ASCII or IntelHex).
lastTimeWritten( model, memoryModelAddress) - VHDL code equivalent is function ram__last__write__time (handle : IN MemHandle; addr : IN bit__vector) return TIME;
memWriteLastTime(hierarchicalDesign, designAddress) - VHDL code equivalent is function ram__last__write__time__hname( hierarchicalName : IN String; addr : IN bit__vector) return TIME;

Initialize accepts as parameters: the number of bits in the address (e.g. sixty-four), the number of bits of data (e.g. thirty-two), and optionally, the type of memory (read only, or read and write). Initialize returns a handle to an instance of the memory model core 210. The handle is used to reference the particular instance of the memory model core 210. If the memory type is read only, then the instance of the memory model core 210 can take advantage of this information to become more space efficient (for example, last transaction pointers need not be kept, see below). For a read only memory, the instance of the memory model core 210 does not have to support a write operation and can take advantage of this to optimize its internal representation. In one embodiment, optionally, a user can provide information that pertains to the internal representation of a memory within the memory model core 210. For example, a user can provide a suggested organization of a memory model tree (described below). This is useful where a user knows that, during a simulation, accesses to the instance of memory model core 210 will be unusual.

Read accepts a memory model core 210 handle and an address. During a simulation, read returns the data at that memory model address.

Write accepts a memory model core 210 handle, an address, and some data. During a simulation, write writes the data into the memory model address.

Using initialize, read, and write, as the core for the memory model 215, many different types of memory models can be developed. These memory models can be used by many different tools.

Optionally, for a system supporting simulation, load-Memory loads an instance of the memory model core 210 with the data contained in a file. This allows, for example, a simulation to be started with data already within memory model 215. In one embodiment, the data file has the format:

```
#address_bits #data_bits
start_addr end_addr <value>+
start_addr end_addr <value>+
. . .,
``` where the first line specifies the number of address and data bits. This information is redundant as it can be obtained from the memory model 215, but it can be used for checking.

In one embodiment including a transaction log, optionally, no transactions are kept during the loadMemory. Further, in an embodiment including a transaction log, transactions are kept where the memory type supports reads and writes, but not read only.

Also, optionally, a dump memory function is supported. This dumps the complete contents of the memory model 215. This is useful for debugging.

Optionally, for a system supporting a transaction log, for example, memory model core 210 can include lastTime-Written. LastWriteTime accepts a memory model core 210 instance's handle and an address. LastWriteTime returns the last time an address was written to within the instance of the memory model core 210. This can be used to determine whether a circuit coupled to the memory model 215 is meeting timing requirements.

Optionally, for a system supporting a transaction log, core interface 211 can include memWriteLastTime. Mem-WriteLastTime accepts a design hierarchy. A design hierarchy can, for example, contain a circuit model 200 that includes a memory model 215. MemWriteLastTime is particularly useful when accessible by a user interface because a user can then determine when a memory was last written and then roll a simulation back to that point. For example, testing model 166 can use the memWriteLastTime and dump memory functions of the core interface 211 to test the instance of the memory model core 210.

Memory Model Examples

The following tables illustrate VHDL examples of the memory models that use the core interface 211. Languages other than VHDL, such as Verilog, can use the core interface 211.

Table 2 illustrates a read only memory (ROM) memory model. The ROM memory model provides the memory data 360 at a given memory address (addr), when the enable goes high.

TABLE 2

```
library CBS;
    use work.Mem_API.all
architecture CBS of ROM is
    signal handle : MemHandle := mem_init(MK_ROM, n_addr n_data);
begin
    READER : process (enable)
        variable v : bit_vector(n_data - 1 down to 0);
    begin
        if (enable'event and enable = '1') then
            mem_read(handle, addr, v);
            data <= v;
        end if;
    end process;.
end;
```

Table 3 illustrates a random access memory (RAM) memory model. The RAM memory model provides the memory data 360 at a given memory address (addr) when the enable goes high and the control is low. The RAM memory model writes data, using the mem_write procedure, to the memory address (addr) when the enable goes high and the control is high.

TABLE 3

```
library CBS;
    use work.Mem_API.all;
architecture CBS of RAM is
    signal handle : MemHandle := mem_init(MK_RAM, n_addr n_data);
begin
    READER_WRITER: process (enable)
        variable bv_addr : bit_vector(n_addr - 1 downto 0);
        variable bv_data : bit_vector(n_data - 1 downto 0);
    begin
        if (enable'event and enable = '1') then
            bv_addr := To_BitVector(addr);
            if (cntl = '0') then
                mem_read(handle, bv_addr, bv_data);
                data <= To_StdLogicVector(bv_data);
            else
                bv_data := To_BitVector(data);
                mem_write(handle, bv_addr, bv_data);
                data <= (others => 'Z');
            end if;
        end if;
    end process;
end;
```

Table 4 illustrates a random access memory (RAM) memory model that has separate read and write processes. In this example, reads and writes are not performed simultaneously, however, it is possible to define a memory model having simultaneous reads and writes.

TABLE 4

```
library CBS;
    use work.Mem_API.all;
architecture CBS_a of RAM is
    signal handle : MemHandle := mem_init(MK_RAM n_addr n_data);
```

TABLE 4-continued

```
begin
    READER: process (enable)
        variable bv_data : bit_vector(n_data - 1 downto 0);
    begin
        if (enable'event and enable = '1') then
            if (cntl = '0') then
                mem_read(handle, To_BitVector(addr), bv_data);
                data <= To_StdLogicVector(bv_data);
            else
                data <= (others => 'Z');
            end if;
        end if;
    end process;
    WRITER: process (enable)
        variable bv_data: bit_vector(n_data - 1 downto 0);
    begin
        if (enable'event and enable = '1') then
            if(cntl = '1') then
                bv_data := To_Bitvector(data);
                mem_write(handle, To_BitVector(addr), bv_data);
            end if;
        end if;
    end process;
end;
```

The above memory models use the same core interface 211. These memory models can be used for simulation, for synthesis, or for some other electronic design automation tool.

Memory Model Tree

Figure 3A:
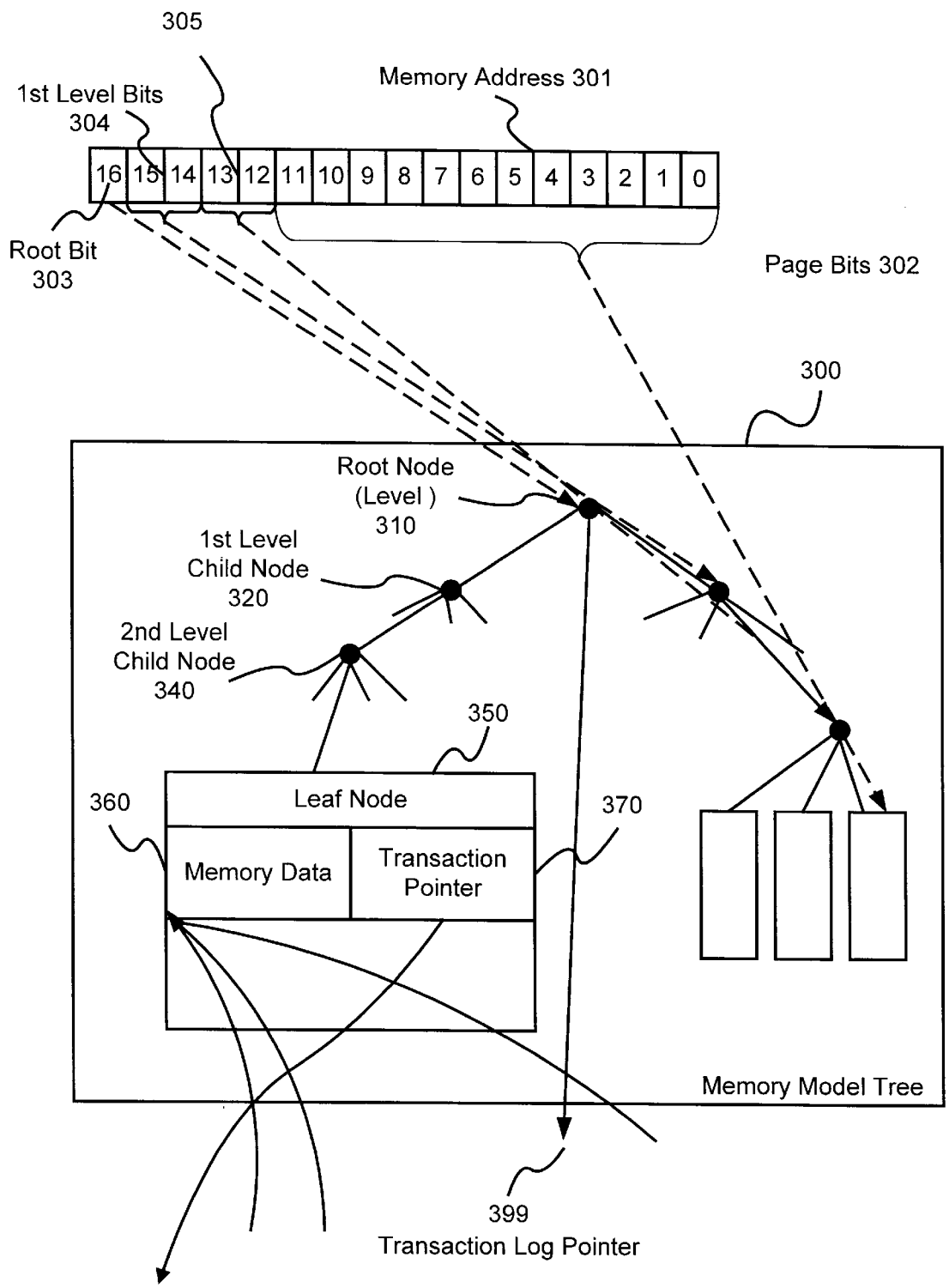
FIG. 3 illustrates a memory model tree and transaction log.

FIG. 3 illustrates one embodiment of a memory model tree 300. In one embodiment, the memory model tree 300 supports the representation of much larger memories than the addressable memory of the computer system 100.

Generally, for each memory model 215, an instance memory model tree 300 is created. The memory model tree 300 is created to include a number of levels. The leaf nodes store memory data 360. Leaf nodes are only allocated when they are needed, not when the memory model tree 300 is instantiated. This saves a great deal of computer system memory from being allocated to represent the memory model 215 if only a portion of the address space of the memory model will be used during a simulation.

Each level of the memory model tree 300 corresponds to a different set of bits of the memory model address 301.

Memory model tree 300 includes a root node 310. Root node 310 points to a number of child nodes, for example, first level child node 320. First level child node 320 points to a number of nodes, for example, second level child node 340. Second level child node 340 points to a leaf node 350. The leaf node includes a page of memory. The page of memory stores the memory data 360. The memory data 360 represents the data stored at an address location for the instance of the memory model core 210.

In one embodiment, root node 310 includes a memory type (e.g. RAM or ROM), a memory model handle (used in a simulation or synthesis to point to the memory model), the number of address bits in the memory model address 301, and the number of bits of data for each address. In one embodiment, root node 310 includes a transaction log pointer 399 that points to transaction log 380 (described below).

Memory model tree 300 can have a number of levels, with a number of children at each level. In this example, memory address 301 is seventeen bits long. Each node in the memory model tree 300 is responsible for a portion of the memory address 301. This allows the memory model tree 300 to break up the address space of the memory model 215 (e.g. 0x00000–0x1FFFF). Root node 310 uses the root bit 303 to divide the address space into two equal parts (e.g. 0x00000–0x0FFFF and 0x10000–0x1FFFF). First level child node 320 uses the first level bits 304 to break the lower half of the address space into four parts (e.g. 0x00000–0x03FFF, 0x04000–0x07FFF, 0x08000–0x0BFFF and 0x0C000–0x0FFFF). Using the second level bits 305, the second level child node 340 breaks one eighth of the address space (e.g. 0x04000–0x07FFF) into four smaller address spaces (e.g. 0x04000–0x04FFF, 0x05000–0x05FFF, 0x06000–0x06FFF, 0x07000–0x07FFF). Each of the leaf nodes use the twelve page bits 302 to access individual locations within the leaf node's page of memory. For leaf node 350, the leaf node uses the page bits 302 to access memory addresses 301 in the range 0x05000–0x05FFF.

In one embodiment, the order of the various level bits and page bits within the memory address 301 is different than shown. For example, the page bits can be the most significant bits while the first level bits can be the least significant bits of the memory address 301. This may be useful if a circuit model 200 has poor memory address locality such as may occur when modeling a circuit that supports a cache. Having flexibility of the ordering of the various level bits and page bits within the memory address 301 may allow more efficient modeling of different types of addressing, such as Big Endian versus Little Endian. (Big Endian addressing means that the address of a datum is the address of the most significant byte, bit, or word etc. Little Endian means that the address of a datum is the address of the least significant byte, bit, or word etc.) In one embodiment, a user can define which level of the memory model tree 300 corresponds to which bits of the memory address 301. Further, in one embodiment, different levels of the memory model tree 300 may use different numbers of bits of the memory address 301.

To reduce the amount of the memory 104 needed to represent a memory model 215, during a simulation, for example, nodes are not allocated until needed. For example, first level child node 320 has only one child node allocated, second level child node 340. A new node is allocated when memory data 360 is written to a memory location that does not have a node previously allocated.

Transaction Log

In one embodiment, during a simulation, a transaction log 380 is kept. FIG. 3 illustrates a transaction log 380. The transaction log 380 allows, for example, a simulation to be rolled back to a certain time during the simulation. In one embodiment, the transaction log 380 can be used by other circuit models for tracking various values during a simulation.

The transaction log 380 includes hyper-ranges, such as hyper-range A 395. A hyper-range defines a time period in which all the transactions in that time period are part of that hyper-range. Each hyper-range includes transaction sets (e.g. hyper-range A 395 includes transaction set A 382 and transaction set B 383). Transaction set A 382 includes a number of transactions. Transaction set A 382 includes a start time and a stop time, indicating the earliest and latest transactions in that set. The hyper-ranges and the transaction sets are used to more easily locate a group of transactions that correspond to a specific time.

In one embodiment, each transaction is associated with a transaction address-transaction data pair. The transaction address-transaction data pair can be used during a simulation to allow a designer to rollback a simulation to a particular point in time and to provide a checkpoint during a simulation. A transaction address includes a time at which the transaction occurred and a pointer to the address in the corresponding leaf node. A transaction data includes the time at which the transaction occurred and the value of the data in the leaf node at that time. In another embodiment, a single transaction represents the relevant information in the transaction address-transaction data pair.

In one embodiment, leaf node 350 includes a transaction pointer 370 for every memory data 360. The transaction pointer 370 points to the previous transaction data for that memory address 301. Transaction pointer 370 points to transaction data A 384. Therefore, transaction data A 384 keeps the value of the previous memory data 360. Transaction data A 384 includes a transaction time (the time the transaction occurred), a memory data value (the value of the memory data 360 when the transaction occurred), and a last data pointer 390. The last data pointer 390 points to the last data value that occurred for this address.

In another embodiment, the leaf node 350 includes the transaction pointer 370 but not the memory data 360. The transaction pointer 370 then points to a transaction data A 384 holding the current value of the memory data 360.

Associated with each transaction data is a corresponding transaction address. For example, for transaction data A 384, a corresponding transaction address A 385 is kept in the transaction set A 382. A transaction address A 385 includes a memory address pointer 372 that points to the memory address 301 corresponding to memory data 360. The transaction address can be used in checkpointing and rollbacks during a simulation.

By traversing the transaction addresses of a transaction set, a checkpoint can be obtained for a particular point in time for a simulation. The checkpoint indicates the memory data 360 value for each address in the memory model core 210 for a particular point in time. In one embodiment, the checkpoint only indicates the memory data 360 value for each address that has been written to during the simulation.

By traversing the transaction data, the value of memory data 360 can be determined over a period of time. In one embodiment, all the values of the memory data included in memory model tree 300 can be determined for any past simulation time by traversing transaction data and/or transaction addresses.

Using a Memory Model

Figure 4:
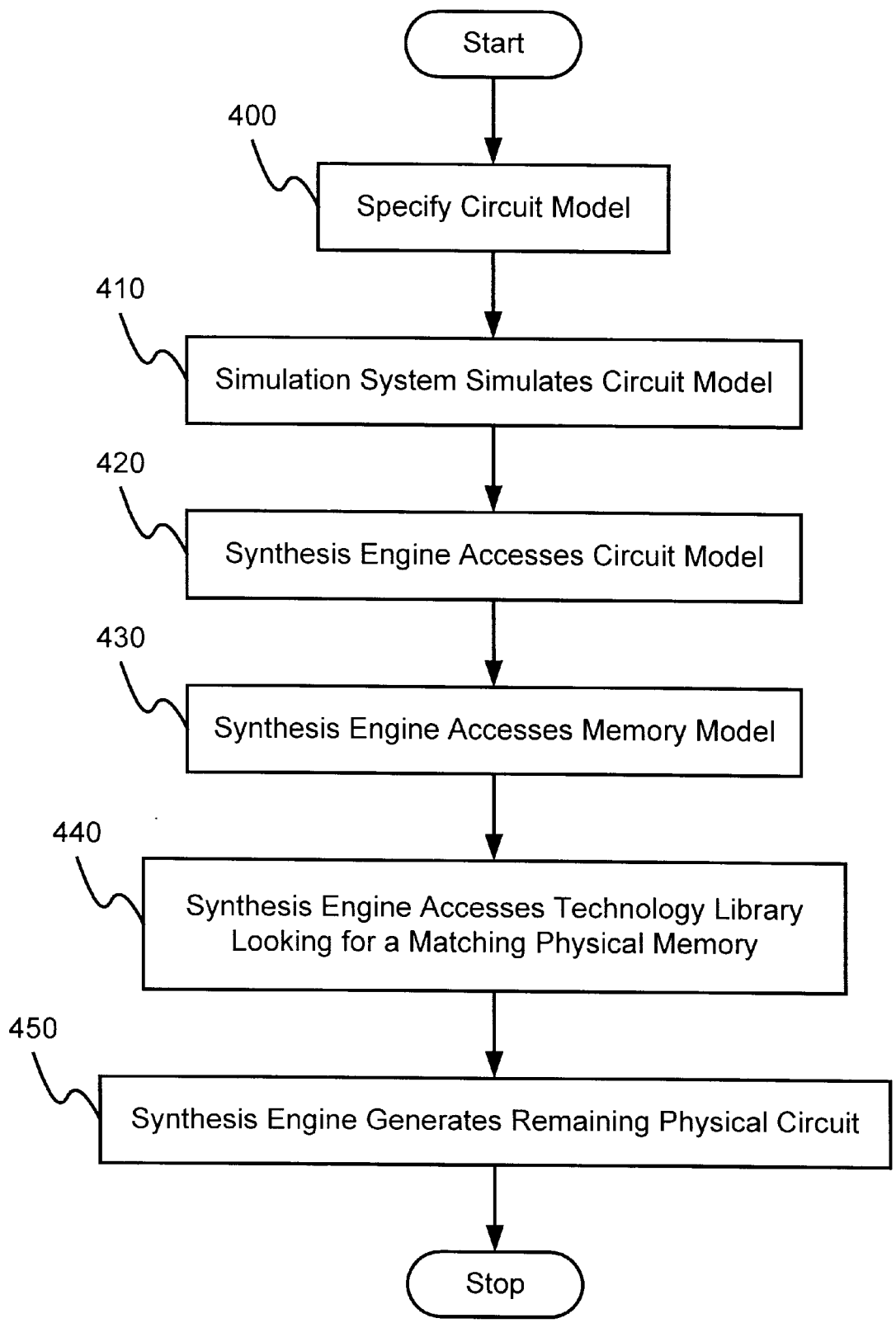
FIG. 4 illustrates an embodiment of a method of using a memory model.

FIG. 4 illustrates one embodiment of a method of using a memory model 215. The order of these steps is illustrative and not necessarily required. This embodiment can be implemented using the computer system 100.

At step 400, the circuit model 200 is specified by a designer. The circuit model 200 includes a memory model 215 that uses the memory model core 210.

At step 410, the simulation system shown in FIG. 1C simulates the circuit model. This is described in more detail below. Step 400 and step 410 can be repeated until the designer is satisfied with the design of the circuit model.

At step 420, the synthesis engine 172 accesses the circuit model 200 from memory 104. As part of the synthesis process, the synthesis engine 172 will attempt to find components in the technology library 173 to implement the function of the circuit model 200.

At step 430, the synthesis engine 172 accesses the memory model 215 that is within the circuit model 200.

At step 440, the synthesis engine 172 access the technology library 173 searching for a physical memory circuit within the technology library 173 that implements the function of the memory model 215. A matching physical memory circuit then becomes part of the physical circuit representation of the circuit model 200. In one embodiment, the technology library 173 defines the functions of some of its physical memory circuits in terms of the memory model core 210. This allows different technology library vendors to use a standard method of defining their physical memory circuits for synthesis tools.

At step 450, the synthesis engine 172 generates the remaining physical circuit representations for the circuit model 200.

Simulating With a Memory Model

Figure 5:
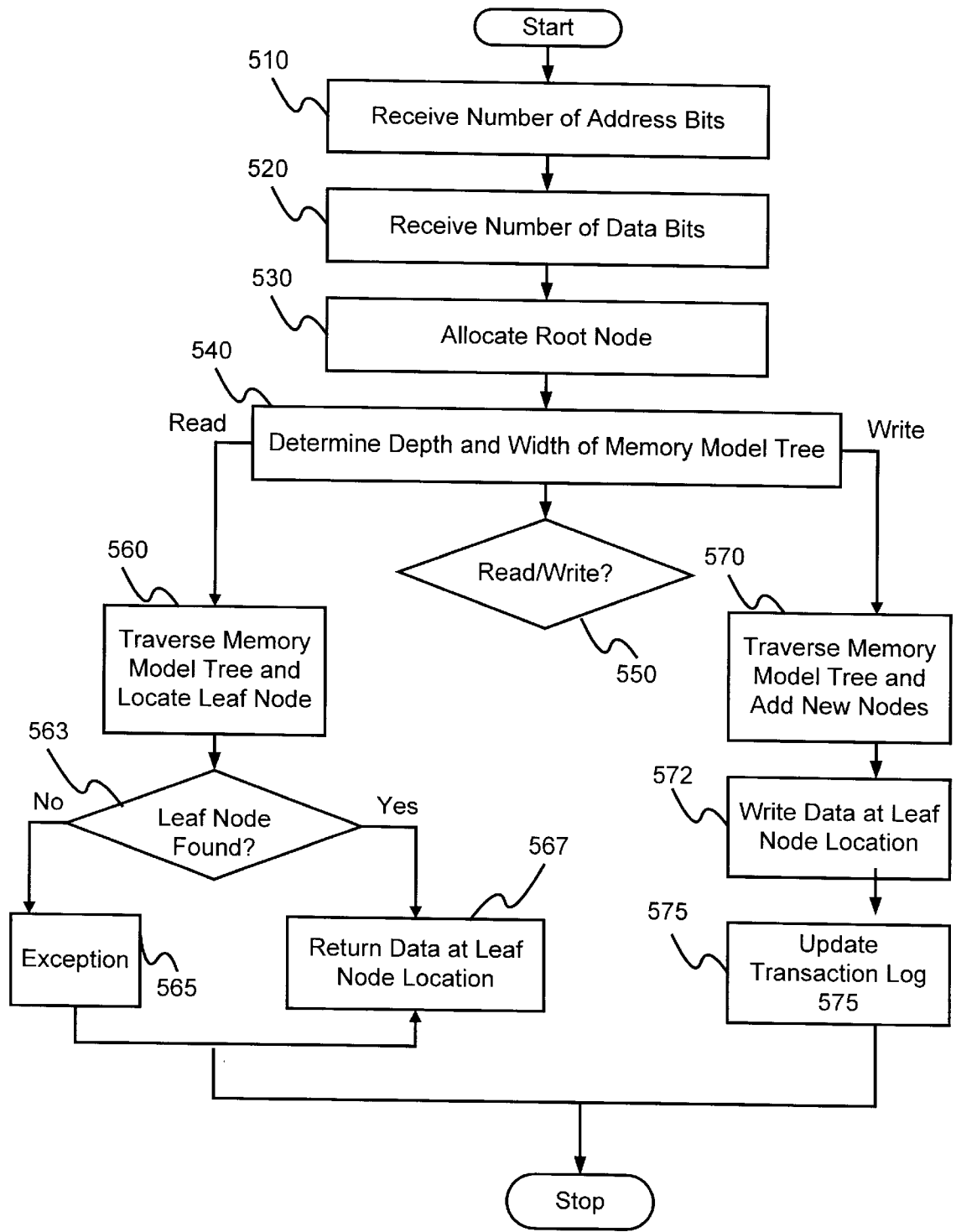
FIG. 5 illustrates an embodiment of a method of simulating a circuit using a memory model.

FIG. 5 illustrates one embodiment of a method for using a memory model. The order of these steps is illustrative and not necessarily required. For example, step 575 can be performed before step 570. Further, some steps can be performed in parallel. This embodiment can be implemented using the computer system 100.

In one embodiment, step 510 through step 540 occur in response to the initialize function of Table 1. Step 550 through step 575 occur as a result of a Read or a Write function of Table 1.

At step 510, a new instance of the memory model core 210 is created. First, the number of address bits used by the new memory model core 210 is accessed. For example, for a sixty-four bit address, the memory model core 210 of FIG. 2 would receive the number sixty-four.

At step 520, the number of bits of data is received. In one embodiment, this number represents the number of bits of information stored at a given memory address. For example if an address corresponds to eight bits of data, then the number is eight. For the example of FIG. 2, the number of data bits is thirty-two and the number of address bits is sixty-four. Of course, this can be programmable to have an address correspond to a minimum number of bits, such as eight bits.

At step 530, a root node 310 is allocated. This is the start of memory model tree 300.

Figure 6:
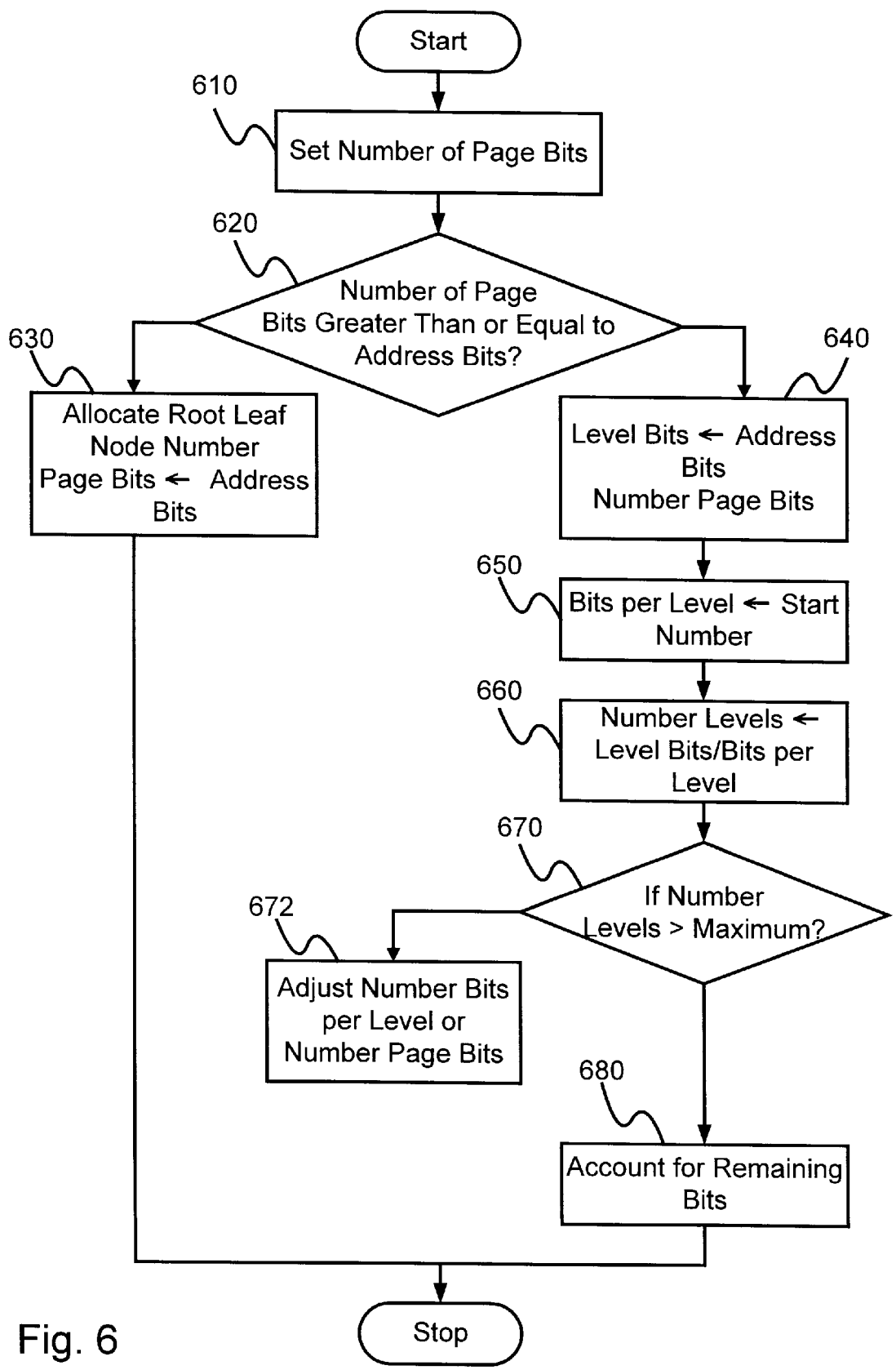
FIG. 6 illustrates an embodiment of a method of determining the characteristics of a memory model tree.

At step 540, a best guess as to an appropriate depth and width for the memory model tree 300 is made. In one embodiment, the number of address bits and the number of data bits are used to make this determination. FIG. 6, discussed below, illustrates one embodiment of step 540. What is important about step 540 is that some attempt is made to structure the memory model tree 300 so that it can be stored and accessed efficiently. The depth determines the number of levels the memory model tree 300 will have. The width determines the number of children each node will have.

At step 550, memory model core 210 receives a read or a write command. If a read is received, then at step 560 the memory model tree 300 is traversed. The memory model tree 300 is traversed by starting at the root. Using the address for the read, the root determines whether the first level child node 320 should be traversed or the other first level child should be traversed. At each level, a node examines different parts of the address to determine which child should be traversed. For example, the root node may, for example, use the most significant bit, while a first level child examines the next two most significant bits.

Once the memory model tree 300 is traversed, at step 563 a test is made to determine whether a leaf node has been found. No leaf node may exist where data has not been previously written to that part of the tree. Remember that, in one embodiment, nodes are not allocated until they have been written to. If no leaf node is found, then at step 565, the memory model core 210 can respond in a number of ways. In one embodiment, at step 565 memory model core 210 raises an exception. In another embodiment, a special value is returned. In another embodiment, a predetermined value, such as zero is returned. What is important is that the memory model core 210 can notify a user that a memory read occurred at a location that was not previously written to. If the leaf node exists, that memory location has been written to before, then at step 567 the memory data 360 is returned. Leaf node accesses the memory data 360 using the remaining part of the address not used by the other levels of the tree. In another embodiment, the leaf node uses the transaction pointer 370 to find the corresponding transaction that contains the memory data 360.

If a write occurred at step 550, then at step 570, the memory model tree 300 is traversed in a manner similar to that used for reading. However, if the address causes a node to access a child that has not been allocated as yet, then that child is first allocated. Thus, in one embodiment, during a simulation, the computer system 100 memory is allocated only when data is written to a memory model address.

At step 572, the memory data 360 is written to the corresponding address in the leaf node.

At step 575, the transaction log 380 is updated. A new transaction address-transaction data pair is included in the transaction log indicating that a write occurred at the specific address in the specific memory model tree 300. Depending on the time of the simulation and the ranges represented by the hyper-ranges and the transaction sets, adding a new transaction may require that a new hyper-range and/or a new transaction set be generated to hold the new transaction. The transaction pointer 370 is updated to point to the new transaction data. Similarly, the last data pointer 390 is updated to point to the last transaction data for that memory address. The new transaction address includes a pointer to point to the address of the memory data 360 in the memory model tree 300.

In one embodiment, where a read is performed, the transaction log 380 is updated. A transaction-address is entered into the transaction log 380. No transaction data need be entered into the transaction log 380 because no new data value is written to the memory model. In one embodiment, where a single transaction is used to keep both the transaction address-transaction data pair information, the transaction data information either can be ignored or can be updated with the read value of the memory data 360. Keeping a transaction for reads allows a user to determine, for example, if a refresh of a DRAM memory model is occurring in a required time period.

Determining Characteristics of a Memory Model Tree

FIG. 6 illustrates one embodiment of a method of determining the width and height of the memory model tree 300. The purpose of this method is to determine the number of children per level and the number of levels a memory model tree 300 should have to provide efficient access to the memory data 360 while still providing efficient storage of the memory data 360 in the computer system 100. In one embodiment, step 610 through step 680 are performed during the initialization of the memory model 215.

At step 610, the number of page bits is set. The number of page bits defines the amount of memory data 360 stored in a leaf node 350. In one embodiment, and in the following example, the number of page bits is predefined to be twelve. This means that every leaf node 350, in the memory model tree 300, is capable of having 4,096 locations/addresses of memory data 360 stored in it. In another embodiment, the number of page bits is definable by the user. In another embodiment, the paging characteristics of the computer system 100 are used to determine an appropriate number of bits per page.

At step 620, a test is made to determine whether the number of address bits equals, or exceeds, the number of pages bits. For the circuit model 200, the number of address bits, sixty-four, exceeds the number of page bits, twelve.

If there are the same or fewer address bits than page bits, then at step 630, a root leaf node is allocated. Thus, the memory model tree 300 includes only the root leaf node. This means that the amount of memory data to be stored in the memory model tree 300 is not large enough to make building a multilevel memory model tree 300 worthwhile. For example, if the number of address bits is ten, then the memory model need support 1024 locations/addresses of memory data 360. As the smallest leaf node 350 size is 4,096 locations/addresses of memory data 360, no additional child nodes need be created.

If there are more address bits than page bits, then at step 640, the level bits (the bits of an address that are not used by the leaf node 350) is set to the number of address bits minus the number of bits per page. For the example of FIG. 2, the number of level bits is initially set to fifty-two (sixty-four minus twelve).

At step 650, the number of bits for each level of the memory model tree 300 is set to an initial value, for example four bits. The number of bits per level determines the number of children a parent node will have. For example if a level has four bits, then a parent will have sixteen children.

At step 660, the number of levels is determined by dividing the number of level bits by the number of bits per level. This initially defines the number of levels required in the memory model tree 300. For the example of FIG. 2, the number of levels is initially set to thirteen (the truncated value of fifty-two divided by four).

At step 670, a test is made to determine whether the number of levels exceeds a predetermined maximum number of levels. In one embodiment, the maximum number of levels is eight. In other embodiments, the maximum number of levels can change dynamically based upon the number of address and/or data bits. In one embodiment, the maximum number of levels can be determined from the type of computer system 100 that is supporting the memory model 215.

At step 680, if the maximum number of levels is exceeded, then the number of bits per level is increased and the number of levels is recalculated. In another embodiment, the number of bits per page is increased and the number of levels is recalculated. The test of step 670 is then performed again. By increasing the bits used by the number of bits per level or the number of bits per page, the number of levels is decreased. In one embodiment, the number of bits per level is increased by four for each iteration of step 680. Table 6 illustrates the iterations of step 670 and step 680 executed for the example of FIG. 2.

TABLE 6

| | |
|---|---|
| Step 660 | #Levels = 13 = Truncate(52/4) |
| Step 670 | #Levels > MaxLevels? True 13>8 |
| Step 680 | Bits Per Level = 8 = 4+4 |
| | #Levels = 6 = Truncate(52/8) |
| Step 670 | #Levels > MaxLevels? False 6>8 |
| Step 690 | Account for Remaining Bits |

At step 690, the maximum number of levels is no longer exceeded, however, there may be some bits that remain unaccounted for because of the truncation of step 670. An additional level can be added to the memory model tree 300 to account for these bits. In one embodiment, the number of bits per page is adjusted. In one embodiment, the number of bits per level is adjusted.

FIG. 6 illustrates one embodiment of determining the width and height of the memory model tree 300. However, other embodiments are within the scope of this invention. The embodiment of FIG. 6 generally results in each level having the same number of children (bits per level is the same for each level), however, in one embodiment, it may be more efficient to vary the number of bits per level of the tree. In another embodiment, the memory model tree may not be balanced. That is, leaf nodes may not all be the same size. Further, in one embodiment, the levels and leaf nodes may be dynamically changed depending upon the memory addresses accessed during a simulation. What is important is that it is possible to attempt to apply some heuristics to the determination of the height and width of the memory model tree 300.

Performing a Checkpoint

Figure 7:
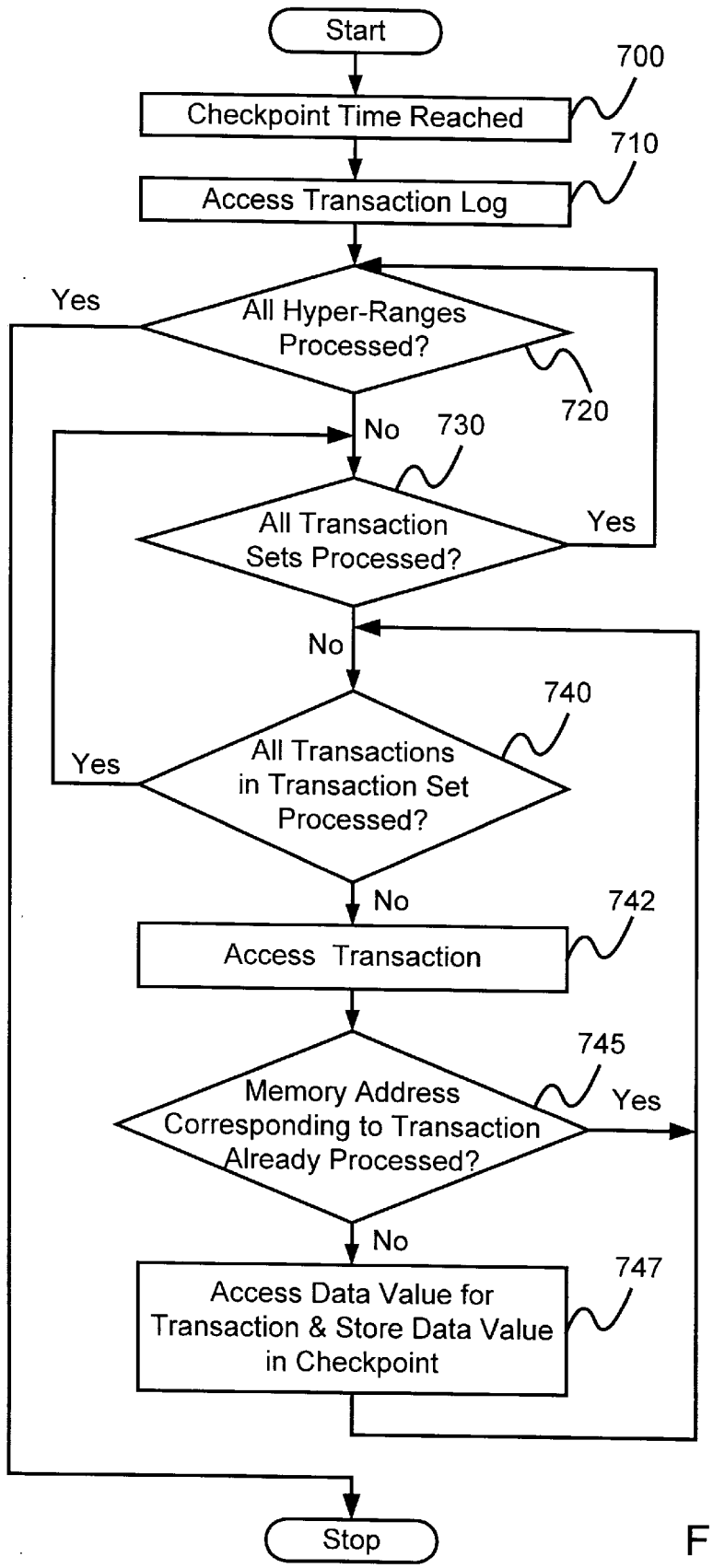
FIG. 7 illustrates an embodiment of a method of performing a checkpoint during a simulation of a circuit model having a memory model.

FIG. 7 illustrates one embodiment of a method of performing a checkpoint. The order of these steps is illustrative and not necessarily required. This embodiment can be implemented using the computer system 100.

A checkpoint is a snapshot of the data in the memory model 215 at a specific point in time. Checkpoints allow a simulation system to more quickly roll a simulation back to a specific point in time of the simulation. In one embodiment, a checkpoint includes an array representing the addresses and the most recent value of the data value written to those addresses during a checkpoint period.

At step 700, the simulation engine 162 determines that a checkpoint time has been reached during the simulation. For example, the user may have decided to have a checkpoint performed at every 5000 cycles (the checkpoint period) of the simulation. Thus, every 5000 cycles of the simulation, a checkpoint time will be reached.

At step 710, the transaction log 380 for a particular memory model is accessed. The transaction log 380 is used to generate the checkpoint.

At step 720, a test is made to determine whether all the hyper-ranges in the present checkpoint period have been processed. Generally, all the hyper-ranges need to be processed. Generally, the most recent hyper-range is processed first.

At step 730, a test is made to determine whether all the transaction sets within the hyper-range that is being processed have been processed. Generally, all the transaction sets in each of the hyper-ranges that are being processed need to be processed to generate a checkpoint. Generally, the most recent transaction set is processed first.

At step 740, a test is made to determine whether all the transactions within the present transaction set being processed have been processed. Generally, the most recent transaction is processed first.

At step 742, assuming that not all the transactions have been processed, then the next transaction in the transaction set is accessed for processing. In one embodiment, this includes the step of traversing the transaction addresses.

At step 745, a test is made to determine whether any data associated with the address associated with the present transaction has been included in the checkpoint. If a data value has already been stored in the checkpoint, then this means that the data for this address was overwritten by a more recent transaction during this checkpoint period. Therefore, there is no need to include the data value in the checkpoint because the data value is not the most current data value for the address during the checkpoint period.

If the test of step 745 fails, then at step 747, the data value for the transaction is stored in the checkpoint. In one embodiment, the data value is the memory data 360 value. The transaction address's memory address pointer 372 points to the memory data 360 value. In one embodiment, where the leaf node does not include the memory data 360 value, the transaction pointer 370 is used to access the transaction data to determining the data value. In one embodiment, the data value is accessed as part of the transaction log.

In one embodiment, the checkpoint is then stored by the simulation system. In one embodiment, the transaction log 380 for the checkpoint period is discarded. This saves memory in the computer system 100.

In one embodiment, the generated checkpoint is merged with the addresses and data values from the last checkpoint. The resulting checkpoint provides a complete snapshot of the data in the memory model at the checkpoint time.

Performing a Rollback

Figure 8:
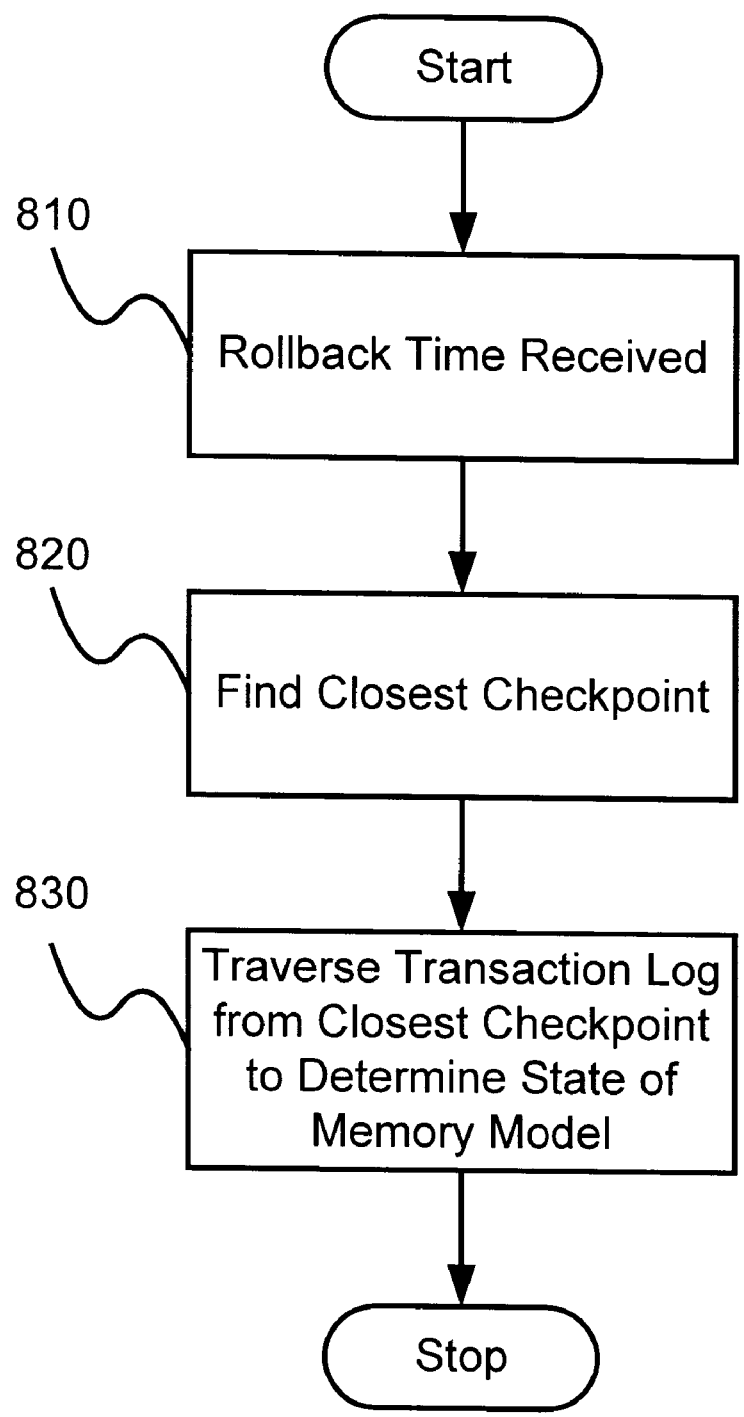
FIG. 8 illustrates an embodiment of a method of rolling back a simulation of a circuit model having a memory model.

FIG. 8 illustrates one embodiment of a method of performing a rollback. The order of these steps is illustrative and not necessarily required. This embodiment can be implemented using the computer system 100.

The rollback allows a designer to roll a simulation back to a previous time of the simulation. This is particularly useful where, for example, the simulation reveals an error in the operation of the circuit model 200 and the designer wishes to roll the simulation back to the point of the error. The designer can then use different test vectors for the simulation to better understand the error.

At step 810, the user of the simulation system provides a rollback time to the simulation system.

At step 820, the simulation system searches its stored checkpoints for a checkpoint nearest the rollback time. Note that if the rollback time is close to the present simulation time, then a checkpoint can simply be generated for that rollback time.

At step 830, the simulation system traverses the transaction log from that checkpoint (forwards or backwards in time) to generate a snapshot of the data values in the memory model. The traversing the transaction log to generate the snapshot is performed in a manner similar to that used to generate a checkpoint. The snapshot is then loaded into the memory model tree; thereby, restoring the memory model to its state at the rollback time.

In an embodiment where transaction logs are discarded after a checkpoint has been generated, the checkpoint prior to the rollback time is used. The memory model is loaded with the checkpoint information using a function similar to the load memory model function. The simulation is then executed on the memory model until the rollback time is reached.

We claim:

1. A system for generating a virtual memory model in a physical memory for simulating a memory device, the system comprising:

memory modeling information including:
   a number of address bits corresponding to a virtual address of the memory device, and
   a number of data bits corresponding to a size of the memory device;
   a common memory model core comprising at least one of a function, a data structure and a model; and
   a memory model interface for providing the virtual memory model with access to the common memory model core by sending the number of address bits and the number of data bits to the common memory model core to retrieve an instance of the memory model core that is the virtual memory model of the memory device, the virtual memory model having an addressable space that is larger than an addressable space of the physical memory.

2. The system of claim 1, wherein the memory modeling information further includes a memory type parameter corresponding to a type of the memory device.

3. The system of claim 2, wherein the memory type parameter indicates one of a RAM type or a ROM type.

4. The system of claim 1, wherein the virtual memory model comprises:

a memory model tree including a root node pointing to a plurality of child nodes, the plurality of child nodes pointing to a plurality of leaf nodes, and each leaf node representing a portion of memory for storing data at a plurality of memory storage locations corresponding to at least one bit of the virtual address of the memory device.

5. The system of claim 4, wherein the memory model tree includes a plurality of levels, wherein each level corresponds to one or more bits of a virtual address for simulating the storing of data at a memory address of the memory device.

6. The system of claim 4, further comprising a portion configured to allocate each of the leaf nodes on an as-needed basis, thereby limiting the addressable space of the physical memory needed to perform the simulation.

7. The system of claim 1, wherein the system points to a transaction log, the transaction log having a plurality of transactions, each transaction corresponding to an access of the virtual memory model.

8. The system of claim 7, wherein the transaction corresponds to a data value written to a predetermined address in the virtual memory model.

9. The system of claim 7, wherein the transaction log includes a first range, the first range defining a time period in which a first set of transactions occurred.

10. The system of claim 7, wherein the transaction includes a transaction data and a transaction address, the transaction data includes a data value corresponding to a data value in the virtual memory model at a predetermined virtual address at a predetermined time, the transaction address corresponding to the predetermined virtual address, the transaction data pointing to a previous transaction data for the predetermined virtual address, the transaction address pointing to the predetermined virtual address.

11. The system of claim 1, wherein the virtual memory model comprises:

a root node at a first level of a plurality of levels of the virtual memory model, the plurality of levels being determined by the number of address bits
   a first child node being a child of the root node, the first child node being at a second level of the plurality of levels, and
   a leaf node relating to the first child node, the leaf node having a plurality of data locations corresponding to data locations within the memory device, the data locations of the memory device requiring a virtual addressable space greater than an addressable space of the physical memory.

12. The system of claim 1, wherein the virtual memory mode is used for synthesizing the memory device.

13. A method for creating a virtual memory model in a physical memory to simulate a memory device, the method comprising the steps of:

accessing a first number of address bits;
   accessing a first number of data bits;
   accessing a common memory model core comprising at least one of a function, a data structure and a model;
   initializing the virtual memory model using the first number of address bits, the first number of data bits and the common memory model core;
   accessing a virtual address value and a data value; and
   writing the data value into a location in the virtual memory model system at the virtual address value, wherein the virtual address value is capable of representing an addressable space greater than an addressable space of the physical memory.

14. The method of claim 13 further includes the step of:

determining a number of levels of a memory model tree using the first number of address bits.

15. The method of claim 14, wherein the step of determining the number of levels of the memory model tree includes the steps of:

determining a first number of page bits using the first number of address bits; and
   determining whether the first number of page bits is greater than or equal to the first number of address bits, wherein if the first number of page bits is greater than or equal to the first number of address bits, then setting the number of levels to be one.

16. The method of claim 13, wherein the step of determining the number of levels of the memory model tree includes the steps of:

determining an initial number of bits per level from the first number of address bits; and
   determining an initial number of levels of the memory model tree, wherein if the initial number of levels exceeds a predetermined value, then setting a second number of bits per level to a larger number than the initial number of bits per level and determining the number of levels per the memory model tree using the second number of bits per level, else setting a number of bits per level to the initial number of levels of the memory model tree.

17. The method of claim 14, wherein the step of initializing the virtual memory model further comprises the step of:

determining a width of the memory model tree using the number of address bits and the first number of data bits.

18. The method of claim 14, wherein the step of initializing the memory model tree further comprises the steps of:

determining a type of the virtual memory model, the type corresponding to a type of the memory device.

19. The method of claim 14, wherein the type of the virtual memory model is one of a RAM or a ROM.

20. The method of claim 14, wherein the steps of initializing the memory model tree further comprises the step of:

allocating a root node for the memory model tree.

21. The method of claim 20, wherein the step of initializing the memory model tree further comprises:

allocating a transaction log associated with the root node, the transaction log provided for storing transaction information associated with the virtual memory model.

22. The method of claim 21, wherein the step of writing the data value into the location in the virtual memory model corresponding to the address value further includes:

writing a transaction into the transaction log, the transaction including the virtual address value and the data value.

23. The method of claim 22, wherein the step of writing the transaction into the transaction log includes:

generating a hyper-range of transactions corresponding to a first period of time;

generating a first transaction set corresponding to a second period of time, the second period of time being within the first period of time; and associating the transaction with the first transaction set and the hyper-range.

24. The method of claim 14, wherein the step of initializing the memory model tree includes generating a root node for the memory model tree, and the step of writing the data value into the location in the virtual memory model corresponding to the virtual address value further includes:

generating a first child node of the root node, the first child node corresponding to a first portion of an address space addressable within the memory device and corresponding to the virtual address value;

generating a first leaf node of the first child node, the first leaf node corresponding to a second portion of the address space addressable within the memory device and corresponding to the virtual address value, wherein the second portion being smaller than the first portion; and storing the data value at a location in the first leaf node at the virtual address value.

25. The method of claim 13, wherein the virtual memory model used for synthesizing the memory device.

26. A computer program product, comprising:

a computer usable medium having computer readable code embodied therein for allowing a user to create a virtual memory model in a physical memory to simulate a memory device, the computer program product including:

computer readable program code devices configured to cause a computer to effect accessing a first number of address bits, a first number of data bits and a common memory model core comprising at least one of a function, a data structure and a model;

computer readable program code devices configured to cause a computer to effect initializing the virtual memory model using the first number of address bits, the first number of data bits and the common memory model core;

computer readable program code devices configured to cause a computer to effect accessing a virtual address value and a data value; and computer readable program code devices configured to cause a computer to effect writing the data value into a location in the virtual memory model at the virtual address, wherein the virtual address is capable of representing an addressable space greater than an addressable space of the physical memory.

27. The computer program product of claim 26 further includes computer readable program code devices configured to cause a computer to effect determining a number of levels of a memory model tree using the first number of address bits.

28. A program embodied in a carrier wave for allowing a user to create a virtual memory model in a physical memory to simulate a memory device, the program performing the steps of:

accessing a first number of address bits and a first number of data bits;

accessing a common memory model core comprising at least one of a function, a data structure and a model;

initializing the virtual memory model using the first number of address bits, the first number of data bits and the common memory model core;

accessing a virtual address value and a data value; and writing the data value into a location in the virtual memory model at the virtual address, the virtual address representing an addressable space greater than an addressable space of the physical memory.

* * * * *